United States Patent [19]

Reuschel et al.

[11] 4,148,931
[45] Apr. 10, 1979

[54] PROCESS FOR DEPOSITING ELEMENTAL SILICON SEMICONDUCTOR MATERIAL FROM A GAS PHASE

[75] Inventors: Konrad Reuschel, Vaterstetten; Wolfgang Dietze; Ulrich Rucha, both of Munich, all of Fed. Rep. of Germany

[73] Assignee: Siemens Aktiengesellschaft, Berlin & Munich, Fed. Rep. of Germany

[21] Appl. No.: 900,896

[22] Filed: Apr. 28, 1978

Related U.S. Application Data

[62] Division of Ser. No. 774,636, Mar. 4, 1977, Pat. No. 4,125,643.

[30] Foreign Application Priority Data

Mar. 8, 1976 [DE] Fed. Rep. of Germany ....... 2609564

[51] Int. Cl.² .................. C23C 11/06; C01B 33/02
[52] U.S. Cl. ............................ 427/8; 23/230 A; 23/232 C; 23/232 E; 423/350; 427/10; 427/86; 427/248 R; 427/95

[58] Field of Search ......... 423/350; 23/230 A, 232 C, 23/232 E; 427/8, 10, 86, 95, 248 R

[56] References Cited

U.S. PATENT DOCUMENTS

| 3,120,451 | 2/1964 | Schmidt et al. | 423/349 |
| 3,900,660 | 8/1975 | Bradley | 423/350 |
| 3,933,985 | 1/1976 | Rodgers | 423/350 |
| 4,068,020 | 1/1978 | Reuschel | 423/349 |

Primary Examiner—John D. Smith
Attorney, Agent, or Firm—Hill, Gross, Simpson, Van Santen, Steadman, Chiara & Simpson

[57] ABSTRACT

A semiconductor material, such as elemental silicon, is deposited on heated rod-shaped mandrels from a reactive gas stream capable of pyrolytically depositing silicon wherein the gas stream is regulated in such a manner that the silicon deposition rate remains constant per cubic centimeter of mandrel surface throughout the deposition process.

4 Claims, 3 Drawing Figures

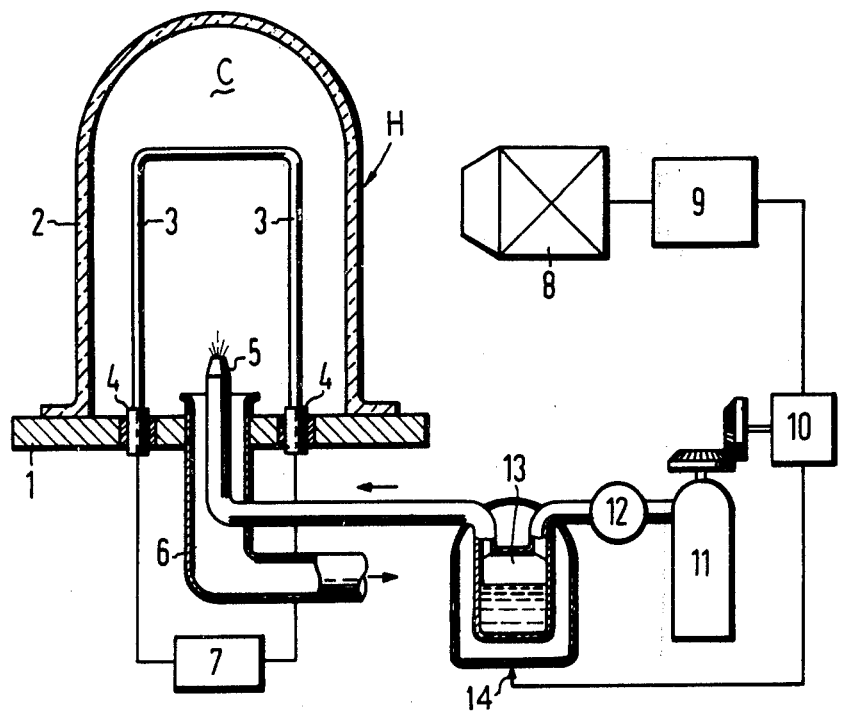

PROCESS FOR DEPOSITING ELEMENTAL SILICON SEMICONDUCTOR MATERIAL FROM A GAS PHASE

This is a division of application Ser. No. 774,636, filed Mar. 4, 1977, now U.S. Pat. No. 4,125,643.

BACKGROUND OF THE INVENTION

1. Field of the Invention

The invention relates to a process of producing semiconductor materials and somewhat more particularly to a process of pyrolytically depositing semiconductor materials, such as silicon, from a reactive gas.

2. Prior Art

German Pat. No. 1,123,300 (which generally corresponds to U.S. Pat. No. 3,120,451) suggests a process for depositing elemental silicon from a gas phase onto a heated surface of a mandrel wherein a reactive gas stream comprised of a mixture of a halogen silane and hydrogen is fed through a hollow reaction housing having the heated mandrel positioned therein and the deposition rate is altered during the course of the deposition process. This prior art process seeks to prevent the deposition of boron present in the reactive gas and to that end suggests that at the beginning of the deposition process, a lesser amount of the reactive gas be fed into the reaction housing and then gradually increasing the reaction gas through-put during the course of the deposition process.

It has been observed that during the course of a pyrolytic or CVD (chemical vapor deposition) process, such as described above wherein a relatively constant reactive gas flow is maintained, the deposition rate relative to a surface unit area on the mandrel and relative to a unit of time progressively diminishes, even when the total amount of, for example, silicon deposited on the mandrel during the unit of time increases proportional to the chronologically actual size of the mandrel surface. Since the temperature of the mandrel surface and the mol ratio within the reactive gas is customarily selected at the beginning of the deposition process so that the rate of deposition is at an optimum, typically at a maximum, the effective deposition rate varies from the optimal rate after the deposition process has run for a period of time because of changing conditions occasioned by the deposition process per se.

SUMMARY OF THE INVENTION

The invention provides a process for depositing semiconductor material, such as elememtal silicon, from a reactive gas wherein a substantially constant deposition rate is maintained throughout the deposition process.

In accordance with the principles of the invention, the temperature of the deposition surface (mandrel) is temporally or chronologically held constant along with the composition of the reactive gas while the flow rate of the reactive gas past the deposition surface is regulated in such a manner that the deposition rate selected at the beginning of the deposition process (which is selected relative to a surface unit area of the mandrel as well as a unit of time) remains substantially unchanged throughout the process.

In certain embodiments of the invention, the flow rate of a reactive gas is increased proportional to the diameter of the deposition surface, which continually increases during the deposition process. In an exemplary form of this embodiment, the diameter of a deposition surface, typically a cylindrically-shaped body which may be solid or hollow, is monitored by an opto-electrical means which produces a signal regulating the proportionality of the reactive gas flow rate to the actual diameter of the deposition surface. In another exemplary form of this embodiment, the exhaust gas from the reaction housing is monitored, as with the aid of a mass spectrograph or a gas chromatrograph and select ions from the exhaust gas are segregated from the remaining components of the exhaust gas so as to produce an appropriate signal which is utilized to control the supply of reactive gas being fed past the deposition surface so that the concentration of the select ions within the exhaust gas remain constant throughout the deposition process.

DESCRIPTION OF THE PREFERRED EMBODIMENTS

Figure 1:
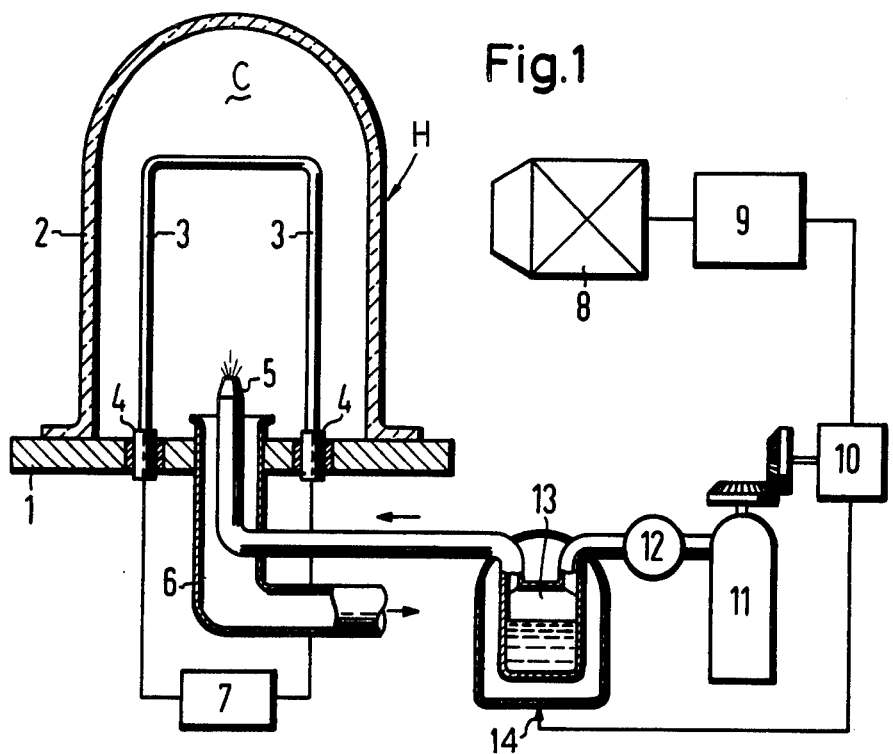
FIG. 1 is an elevated somewhat schematic view of an apparatus useful in the practice of the invention.

The invention provides a process for depositing semiconductor materials, such as elemental silicon, from a reactive gas capable of pyrolytically depositing the semiconductor material onto a heated mandrel or carrier surface wherein the semiconductor material deposition rate remains constant or substantially constant per surface unit area of mandrel surface.

In accordance with the principles of the invention, the temperature of the deposition surface and the mol ratio of the components within a reactive gas are temporally or chronologically held constant while the flow rate of the reactive gas stream past the deposition surface is controlled in such a manner that the selected deposition rate at the beginning of the deposition process (which is selected relative to a surface unit area of the mandrel as well as relative to a unit of time), remains relatively constant throughout the deposition process.

In the following description of the invention, the process will be described on the basis of producing elemental silicon from a reactive gas mixture consisting of hydrogen and trichlorosilane. However, this is for convenience only and the invention may also be practiced with other thermally decomposable halogen semiconductor compounds capable of yielding a select semiconductor material as well as with other silicon halides, for example, such as $SiCl_4$, $SiBr_4$, $SiCl_2H_2$, as well as with other suitable thermally decomposable semiconductor compounds.

The term "through-put" as used herein and in the claims is defined as the amount of a reactive gas passing a heated deposition surface during a unit of time. Accordingly, the flow rate of a reactive gas stream increases as a higher through-put is selected. Based on previous observations, the deposition of silicon on a constant temperature deposition surface depends on the through-put of a suitable reactive gas, for example, consisting of a mixture of $SiHCl_3$ and $H_2$. On the other hand, the relation:

$$\eta = 0.1 \, MV^{-0.4} \tag{1}$$

was confirmed between the deposition yield $\eta$ and the mol ratio MV for $SiHCl_3/H_2$. Since silicon deposition is a function of the reactive gas through-put, f, and of a select value for MV, the relation:

$$A_{Si} = f \times MV \times 28/25 \qquad (2)$$

is derived wherein $A_{Si}$ is the amount of silicon deposited per hour, f and MV are defined as above; 28 is the mol volume of the reactive gas at 730 mm Hg (which experience has demonstrated to be the gas pressure within the reaction housing during a silicon deposition process as described hereinabove) and 20° C.; and 25 is the atomic weight of silicon. By combining relations (1) and (2) above, one obtains:

$$A_{Si} = 0.112 \, MV^{0.6} \times f \qquad (3)$$

This relation, (3), was effectively confirmed via experiments conducted in accordance with the principles of the invention for a mol ratio in the range of 0.02 to 0.12 and for a deposition temperature in the range of 1400° to 1450° K.

Conversely, the amount of silicon deposited per hour, $A_{Si}$, may also be obtained from the product of a specific deposition rate, Z, on a total surface, O, of an electrically heated silicon rod which is used as a deposition mandrel, so that the relation:

$$A_{Si} = Z \times O \qquad (4)$$

is valid. Typically, rod-shaped carrier bodies or deposition mandrels are utilized during this type of deposition process, so that for such mandrels one may note that:

$$O = d \times l \times \pi \, (cm^2) \qquad (4a)$$

wherein $\pi$ is the ratio of the circumference of the rod-shaped mandrel to the diameter thereof; d is the diameter of the mandrel and l is the length of the mandrel. Then, from relations (3), (4) and (4a) above, one may derive:

$$A_{Si} = Z \times d \times l \times \pi = 0.112 \, MV^{0.6} \qquad (5)$$

wherein Z is a specific deposition rate measured in g/hr $cm^2$ (grams per hour per centimeter square); d is measured in centimeters and l is measured in centimeters. It is to be noted that Z may also be determined to a considerable degree by the geometry and size of the reaction or deposition housing. If, for example, a suitable deposition temperature is utilized in an apparatus of the type illustrated in the drawings and if the inner diameter of the reaction housing (reaction chamber) is 240 mm, then a Z value equal to 0.127 is optimum because with a greater deposition rate (i.e., Z = 0.5) undesirable deposition in the free gas phase and on the interior walls of the reaction housing occurs. From the foregong relations, one derives:

$$d = f \times 0.112 \, MV^{0.6} / Z \times l \times \pi \qquad (6)$$

or when Z = 0.127, one obtains:

$$d = f \times 0.28 \, MV^{0.6}/l \qquad (6a)$$

or, because l and MV remain constant, one obtains:

$$d = const. \, f \qquad (7)$$

Consequently, in the practice of the principles of the invention, for this embodiment the deposition process comprises controlling the reactive gas through-put (and thus the total gas flow-through and thus the flow rate of the reactive gas stream through the reaction chamber), so that the gas through-put increases proportionally to the particular or chronologically actual diameter of the cylindrically-shaped mandrel (which continuously grows larger during the deposition process).

Before discussing the various apparatus illustrated in the drawings which are useful for practicing the invention, it is to be noted that a main feature of the invention is to allow one to select a specific deposition rate, Z, at an optimum value and to maintain this value throughout the entire deposition process. In that regard, it is desirable to make Z as large as possible, but in so doing to also insure that neither deposition of, for example, silicon, in the free gas phase nor deposition of silicon on the interior walls of the reactive housing occurs. For this reason a deposition rate, Z, is selected so as to be at least about 0.1 gram per square centimeter per hour and less than about 0.5 gram per square centimeter per hour no matter what deposition temperature or what mol ratio of components in the reactive gas are utilized. When a deposition apparatus of the type shown in FIG. 1 is utilized to practice the invention, a specific deposition rate of Z = 0.127 g/hr $cm^2$ and a deposition temperature of about 1400° C. have produced especially favorable results so that an effort is made to maintain, as much as possible, these parameters over the entire deposition process. As stated, a deposition rate, Z, of 0.127 g/hr $cm^2$ is useful in a reaction chamber having a diameter of 240 mm, however, for larger diameter chambers or reaction housings, a Z value of 0.5 g/hr $cm^2$ may be more closely attained.

With the apparatus illustrated at FIG. 1, one may practice the process of the invention with a rod or tube-shaped deposition mandrel and proportionally control the flow rate of a reactive gas past such mandrel in accordance with a particular diameter of the mandrel. This deposition apparatus is a typical reaction housing H for deposition of, for example, polycrystalline silicon and is comprised of a metallic base plate 1 composed of a metal resistant to the reactive gas utilized and an enclosure or hood 2, composed of quartz or some similar transparent and resistant material. The hood 2 is sealed in a gas-impermeable manner onto the base plate 1. Electrodes 4 are operationally positioned within spaced-apart apertures in plate 1 in a gas-impermeable manner and so as to be electrically insulated from each other. The outer ends of the electrodes 4 are connected to a controlled source 7 of electrical energy and the inner ends thereof protrude into the reaction chamber C defined by the housing H. The inner end of each electrode 4 is connected to a respective end of a somewhat U-shaped rod or mandrel 3, composed of, for example, hyperpure elemental silicon, so that the mandrel or deposition body is maintained in an upright position within the chamber C. A gas inlet conduit 5 and a gas outlet conduit 6 may be concentrically mounted within one another as shown and attached in a gas-impermeable manner to the base plate 1 to provide ingress for reactive gas to the reaction chamber and to provide regress for the exhaust gas therefrom. The controlled electrical energy source 7 is constituted in such a manner that once a deposition temperature is selected (in accordance with an optimum deposition rate, for example, silicon is optimally deposited at a temperature in the range of 110° to 1450° C.) and is attained on the surface of the mandrel 3, this temperature is chronologically constantly maintained throughout the deposition process. Accordingly, electrical source 7 includes a means for controlling or regulating the current fed to the mandrel, for example, such as described in German Pat. No. 1,221,612 or German Offenlegungsschrift No. 2,133,863 (which generally corresponds to U.S. Pat. No. 3,832,626) or German Offenlegungsschrift No. 2,201,199 (which generally corresponds to U.S. Pat. No. 3,821,515). An essential feature of electrical current control means is that an effective value of the current supplied to the mandrels is increased during the duration of the deposition process because the newly deposited silicon layers are also current conducting and must be heated to the deposition temperature for additional silicon to be deposited thereon. Accordingly, the specific embodiment or construction of a controlled current source 7 is immaterial for the practice of the invention and instead any means providing a temporal constancy of a select deposition temperature is useful. Thus, for example, the cylindrically-shaped mandrel may also be heated in a manner other than by a direct current supply, as for example, via an induction field or an energy radiation source, such as a laser.

In the embodiment illustrated at FIG. 1, a TV camera means 8 is positioned so as to constantly monitor the carrier body or mandrel 3. Preferably, the TV camera means 8 is orientated in respect to the mandrel 3 in such a manner that the scanning lines on the vidicon of the TV tube coincide with the diameter of the image of the mandrel on the vidicon. With this alignment, the electrical pulses supplied by the TV camera means are useful as a criteria for the actual meansurement of the diameter, d, of the cylindrical mandrel so that this use of a TV camera means corresponds to analogous conditions encourntered in monitoring the diameter of a melt zone during zone refining of silicon rods. Further details of this type of operation may be derived from the disclosure of German Offenlegungsschrift No. 1,113,720. Further, as an alternative to the direct measurement of the mandrel diameter, the current strength allocated for a specific mandrel diameter at a specific temperature may also be used to control the reactive gas through-put.

The electrical pulses or signals obtained from the TV camera means 8 may be evaluated to obtain a first derivative $dr/dt$ and a second derivative $d^2r/dt^2$, wherein $r = r(t)$ and r is the radius of the monitored mandrel (i.e., $r = d/2$) as a function of time, t. To accomplish the foregoing analysis, a computer means 9 is operationally coupled to the camera means 8. The computer means analyzes the signal received from the camera means 8 and generates a control signal for controlling and regulating the flow rate of a reactive gas through the reaction housing H via a control mechanism 10 in such a way that a specific growth rate or specific deposition rate Z remains constant or relatively constant throughout the deposition process as the diameter of the mandrel changes (via the newly deposited layer of silicon). It should be recognized that the first derivative $dr/dt$ is directly proportional to Z so that the entire operation amounts to maintaining a constant $dr/dt$.

In order to generate a fresh or further supply of a reactive gas, a reservoir 11, for example, containing $H_2$, is provided with a valve means controlled by the computer means 9 via the control mechanism 10. The second derivative $d^2r/dt^2$ may, in this control scheme, function as a control value for correcting the amount of $H_2$ flowing out of the reservoir 11 per unit time, as per second. The $H_2$ flows out of reservoir 11 via an appropriate conduit having a flow meter 12 therein and into a vaporizer 13 filled, for example, with liquid $SiHCl_3$. The vaporizer 13 is provided with another conduit for directing the $H_2$ — $SiHCl_3$ gas mixture (i.e., the reactive gas) to the gas inlet 5 of housing H. The vaporizer 13 is provided with an operational thermostat means 14 coupled to computer means 9 via the control mechanism 10 to adjust the temperature of the vaporizer pursuant to the signal received from the camera means and to thus control the amount of $SiHCl_3$ in the reactive gas fed to the reactive chamber C.

In some instances, the process of the invention may be practiced merely by controlling the $H_2$ flow, as with the computer means 9, especially in instances where relatively low gas flow rates are required. It must be recognized that the amount of entrained $SiHCl_3$, i.e., the mol ratio MV, is dependent not only on the flow rate of $H_2$ but also on the temperature within vaporizer 13. In this regard, a proportionality of $H_2$ to $SiHCl_3$ may be anticipated with moderate temperature alterations, and then only approximately. In general, however, the temperature provided by thermostat means 14 must be raised somewhat in accordance with an increase in the flow rate of $H_2$ in such a way that the MV remains constant at a selected optimum value, i.e., MV = 0.08, during the entire deposition process. Accordingly, a control of the thermostat means 14 coupled with the valve setting on the $H_2$ reservoir 11 may be utilized.

Another embodiment of the invention is based on monitoring the amount of a select ion or component within the exhaust gas flowing from the reaction housing and generating a control parameter based thereon for maintaining Z constant or substantially constant throughout the deposition process. In the discussion of this embodiment of the invention, an exemplary reactive gas comprised of a mixture of $H_2$ and $SiHCl_3$ will be referred to and with such a reactive gas, a hydrogen halide, particularly HCl, is always formed as a by-product of the deposition process, such as shown by the following equilibrium equation:

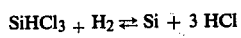
$$SiHCl_3 + H_2 \rightleftarrows Si + 3 HCl$$

Since a flowing gas stream is utilized, the concentration of a hydrogen halide in the exhaust gas increases with an increasing silicon surface and decreases with an increased gas through-put, under otherwise constant conditions.

Accordingly, in a form of this embodiment, the concentration of a hydrogen halide, particularly HCl, within the exhaust gas flowing out of the reaction housing, as via gas outlet 6, is constantly monitored and the flow rate of the reaction gas past the mandrels is regulated in such a manner that the concentration of hydrogen halide in the exhaust gas remains constant.

Since the amount of hydrogen halide in the reaction gas within the reaction chamber is a criteria for the degree to which the deposition reaction is at least approaching an equilibrium condition in accordance with the equation:

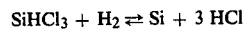
$$SiHCl_3 + H_2 \rightleftarrows Si + 3 HCl$$

a constant and optimum specific deposition rate, Z, may be attained if the HCl concentration in the vicinity of the mandrel is essentially kept constant during the deposition process. Since an increase or decrease in the HCl concentration within the exhaust gas is a signal that a deviation from the constant and optimum deposition rate has occurred, one may also practice the invention by keeping the specific deposition rate constant or at least optimum by maintaining a constant or substantially constant concentration of HCl in the exhaust gas via a suitable control of the flow rate of the reactive gas entering the reaction chamber.

Figure 2:
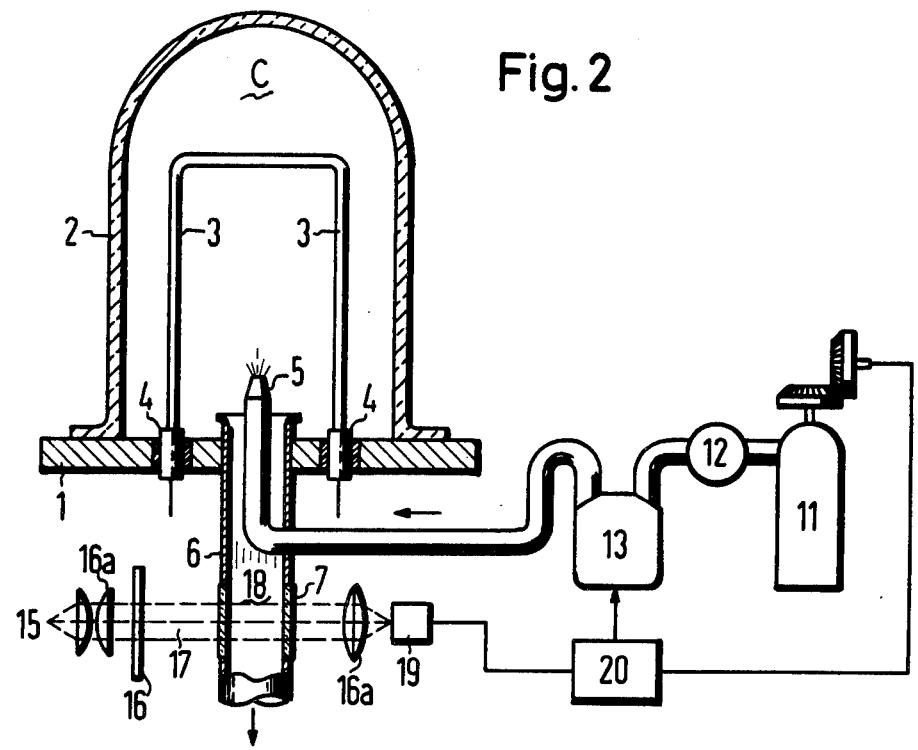
FIG. 2 is a somewhat similar view of another apparatus useful in the practice of the invention.

An apparatus suitable for practicing the foregoing embodiment of the invention is illustrated at FIG. 2, where like reference numerals are utilized to designate like elements, as described in FIG. 1. As shown, a gas outlet 6 is provided with a transparent section 7 which allows optical examination and monitoring of the exhaust gas stream 18 flowing from the reaction chamber C. A light source 15 generating polychromatic light is positioned to generate a light beam which passes through suitable imaging lens 16a and a corresponding filter 16 to produce a controlled monochromatic light beam 17 having a wavelength which coincides with an absorption peak or band of the HCl molecule or other hydrogen halide molecule which is being monitored (if necessary, an electrical flow-discharge which takes place in dilute HCl may be utilized as a monochromatic light source). As the light beam 17 passes through the flowing exhaust gas stream 18, it is captured by an appropriately positioned photo-electric cell means 19. As must be apparent, the beam 17 is weakened in proportion to the HCl concentration in the exhaust gas stream 18 and the degree of weakening is a criteria for the then present concentration of HCl in the exhaust gas.

Because a preferred reaction gas is composed of $H_2$ and $SiHCl_3$, or, alternatively, $H_2$ and $SiCl_4$, substantial amounts of hydrogen silane, particularly $SiHCl_3$ or $SiCl_4$, are, as a rule, still present in the exhaust gas stream 18. Accordingly, the selection of a wavelength for the beam 17 must be such that the selected wavelength does not coincide with an absorption peak or band or any silicon halide molecules within the exhaust gas stream. It is recommended that the wavelength of the HCl absorption spectrum, i.e., 1.76 $\mu$m, be utilized as the absorption wavelength for beam 17. Because this wavelength is in the infra-red region, a suitable light source 15 and a suitable filter 16 as well as suitable imaging lens means 16a must be used in forming beam 17, along with a suitable infra-red sensitive photo-electric cell 19.

In these situations, the so-called Nernst lamp is recommended, for example, as the light source 15 and a so-called interference filter is recommended as filter means 16, along with mineral salt lenses for lens means 16a. A suitable photo-electric cell is, for example, a photo-diode composed of a semiconductor material selected from the group consisting of indium antimonide, indium arsenide, gallium antimonide or mixed crystals of any of the foregoing along with AsGa. Further, suitable photo-electric cells may be composed of semiconductive $A_{II}B_{VI}$ compounds whose composition is individually controlled in such a manner that the resulting photo-electric cells is sensitive for a maximum wavelength of 1.76 $\mu$m.

The signal emitted by the photo-electric cell means 19, is, in turn, fed to an evaluator 20 which in turn produces a signal for controlling the flow rate of the reaction gas, similarly to the computer arrangement described in FIG. 1. In this regard, it must be recognized that as the diameter of the deposition surface (mandrel 3) increases during the deposition process, the HCl concentration raises proportionately to the increase of surface area on the mandrel or deposition surface and the increased HCl concentration, naturally, is noticeable in the exhaust gas. This phenomena effects the light beam 17 by an increased weakening of the radiation intensity impinging on the photo-electric cell 19. By increasing the amount of fresh reactive gas to the reaction chamber, and thus increasing the gas flow rate, the increase in the HCl concentration noted above is counteracted. Accordingly, in one form of this embodiment of the invention, the signal emitted by photo-electric cell 19 is fed to an evaluator means 20 in such a manner that means 20 maintains a sufficient supply of fresh reactive gas to the reaction chamber to maintain the concentration of HCl in the exhaust gases constant or relatively constant based on an optimum Z value.

In addition to the just-described means of monitoring the HCl content in the exhaust gas, other monitoring and control means may also be utilized. However, in any selected monitoring and control means, it must be recognized that the exhaust gas contains, as a rule, the addition to HCl or some other hydrogen halide being monitored, a considerable amount of the hydrogen silane utilized in the reactive gas, such as $SiHCl_3$, and that the chemical and physical behavior of hydrogen silane is, in many respects, similar to that of HCl or some other halide specie being monitored. Thus, for example, it is almost impossible to chemically separate HCl out from the exhaust gas without having new HCl generated therein by the chemical conversion of the available $SiHCl_3$ so that the parameters being measured or monitored may be falsified.

One of the other monitoring means useful in the practice of the invention may be based on mass spectroscopy, another may be based on the Raman effect and yet another may be based on gas chromatography. For example, a portion of the exhaust gas may be fed into a gas chromatography means which quantitatively determines the amount of HCl in the portion via heat conductivity measurement cell and generates a signal corresponding to the concentration of HCl in the exhaust gas which may then be utilized to control the through-put of fresh reactive gases within the reaction chamber.

Figure 3:
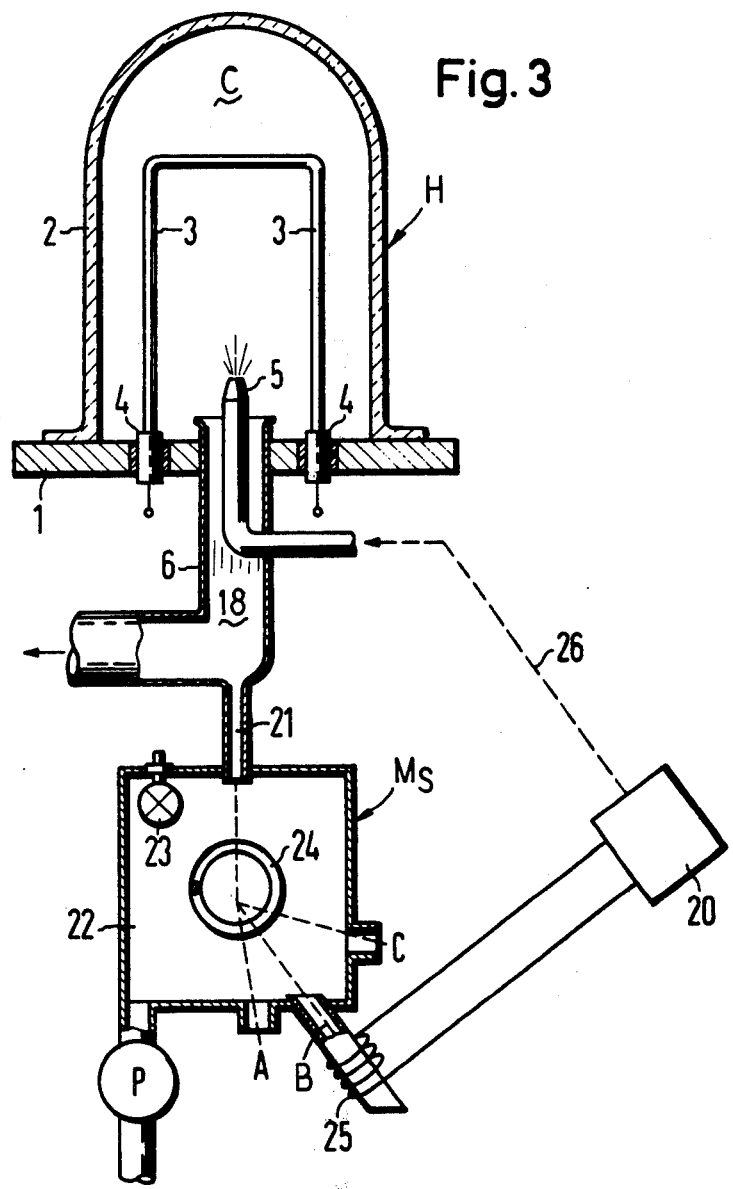
FIG. 3 is an elevated somewhat schematic view of yet another apparatus useful in the practice of the invention.

An embodiment of the invention based on mass spectroscopy will be explained with the aid of an apparatus as shown at FIG. 3. The schematic shown in FIG. 3 is limited, for the sake of brevity, to solely portions of the reactive housing H and the means utilized to monitor the spent or exhausted reactive gas. As shown, the gas outlet 6 leading exhaust gases away from the housing H is provided with a branch line 21 which communicates with a mass spectrograph $M_S$. The mass spectrograph is comprised of an enclosed hollow housing 22, the interior of which is constantly evacuated by a suitable pump means P and is thus constantly maintained at an extremely low pressure. Positioned within the interior of the housing 22 is a means 24 for generating a constant electrical and/or magnetic field and a means 23 for ionizing the atmosphere within housing 21. Because the respective gas molecules within the exhaust gas have different masses, the exhaust gas molecules which pass into the mass spectrograph $M_S$ are converted into corresponding molecular ions, which are then, by virtue of their differing masses, accelerated in a different manner from other ions via the electric or magnetic field within the mass spectrograph. If a magnetic field is utilized, then in addition to a tangential acceleration, a normal acceleration also takes place, i.e., a different deflection from the original or normal path of travel of an ion, which is dependent on the respective mass of the ion involved.

For example, the ionization means 23 may comprise a UV-light source, an X-ray source or a radio-active substance. Preferably, the ionization means 23 is physically positioned within container 22, although if necessary, it may be positioned outside the container and a suitable communication means is provided between such outside ionization means and the interior of the mass spectrograph. Preferably, the pump means P should be capable of maintaining the interior of housing 22 at a pressure of about $10^{-6}$ Torr. The means 24 for generating, for example, a magnetic field, may comprise a coil having a direct current flowing therethrough for generating a magnetic field within housing 22. The exhaust gas flowing into the interior of housing 22 enters the mass spectrograph substantially perpendicularly to the magnetic field lines therein and is ionized so that $SiHCl_3$ ions, HCl ions and $H_2$ ions are formed. The magnetic field causes, for example, the $SiHCL_3$ ions to be directed to a point A, the HCl ions to a point B and the $H_2$ ions to a point C. For the present discussion, it is only important to note that the stream of ions impinging at point B, i.e., the HCl ions, are being monitored. This function is accomplished by providing a coil 25 about the path of the HCl ions and coupling the coil to an evaluator means 20, which in turn, via an appropriate control circuit 26, regulates the amount of reactive gas through-put past the mandrels within housing H, in a manner somewhat similar to that described in conjunction with FIGS. 1 and 2. As will be appreciated, moving ions produce an electrical current of a voltage J in accordance with the relation;

$$J = v \times N \times e/l$$

wherein N is the HCl ions passing through an entire cross-section of the ion path per second; v is the average speed of the travling ions; e is the electronic particle charge; and l is the distance traveled per second by the HCl ions. Accordingly, the coil 25 senses the current so-created as well as any changes therein and generates a corresponding signal which is transmitted to the evaluator means 20. In this manner, the concentration of HCl in the exhaust gas stream 18 is readily monitored and utilized to produce a constant and optimum deposition rate of, for example, silicon on the mandrel. The signal generated by coil 25 is proportional to the concentration of HCl in the exhaust gas stream and this signal is utilized to control and regulate the fresh reactive gas supply in such a manner that the HCl content of the exhaust gas, and thus the HCl ion stream generated and measured within the mass spectrograph, remains constant and the optimum specific deposition rate Z remains substantially constant throughout the entire deposition process.

An advantage of proceeding along the principles of the invention as outlined above lies primarily in the fact that a decrease in the specific deposition rate as a result of HCl enrichment within the reaction chamber is effectively counteracted and provides an increased silicon yield over a shorter deposition time period. As a rule, the described deposition process yields polycrystalline silicon which may be converted into monocrystalline state by zone melting the enlarged silicon rods obtained via the deposition process.

It will be appreciated that the principles of the invention may also be applied to production of other semiconductor materials, for example, germanium, by using a reactive gas comprised of germanium halides and hydrogen. In such a process, a hydrogen halide is produced as a by-product of the deposition process and may be monitored in an analogous manner to that described for silicon deposition.

Further, the principles of the invention may also be applied to produce semiconductor compounds from a suitable gas phase, at least as long as halogen-containing compounds of the components for the semiconductor exist and are used in the reactive gas.

In summation of the last-described embodiment (FIG. 3) of the invention, it may be stated that:

1. The gas phase deposition process which produces polycrystalline silicon rods encounters continuously changing deposition conditions during a given run since the deposition surface constantly increases as the result of the continual growth of the mandrel diameter. Accordingly, it is necessary or at least advantageous to continuously adapt the remaining variable process parameters to the most optimum values possible and this embodiment of the invention readily accomplishes such control.

2. In the other embodiment (FIG. 1) of the invention, a $H_2$—$SiCHl_3$ gas mixture through-put was linearly increased in accordance with continuous growth of the mandrel diameter. However, control on such basis is problematic inasmuch as the reactive gas volume within the reaction chamber cannot increase so that finally, the residence time of the reactive gas at the reaction site becomes too small, resulting in inefficiency. The embodiment under discussion here avoids this difficulty.

3. In one assumes that the deposition temperature and the composition of the reactive gas mixture (the MV discussed earlier) remain constant throughout the deposition process for maximum silicon yield, then only a select increase in gas through-out remains. Such an increase may, for example, be based on the HCl content in the exhaust gas which is formed in accordance with the reaction:

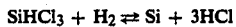

$$SiHCl_3 + H_2 \rightleftarrows Si + 3HCl$$

The above reaction is accompanied by secondary reactions which, however, have no substantial influence on the basic reaction. Corresponding to a practically unachievable equilibrium, is a defined HCl portion in the exhaust gas mixture, which is lower at an optimally maintained deposition rate. Under otherwise constantly held conditions, the HCl concentration increases with increasing reaction surface. By increasing the gas through-put, the HCl portion may be brought back again to the initial optimum value. In this manner, by keeping a constant or substantially constant amount of HCl in the exhaust gas via a controlled increase in the gas through-put, the deposited amount of silicon can be steadily increased while simultaneously the conversion rate of the reactive gas can be maintained within an optimum range.

Further, monitoring of the HCl content in the exhaust gas may be done quantitatively, as by an IR-spectroscope means, chromatograph means or some other means. The gas through-put increases at the beginning of the deposition process proportionally to the diameter of the silicon rods or mandrels; however, when a greatly increased through-put is attained, it deviates more greatly from proportionality (to the mandrel diameter) because of the decreasing residence time of the gas in the reaction housing so that gas through-put can no longer be increased to the same degree. A similar procedure may also be followed with other reactions, for example:

$$SiCl_4 + H_2 \rightleftarrows Si + 4HCl, \text{ etc.}$$

The principles of the invention may also be applied for deposition of other semiconductor elements, such as germanium, selenium, boron, etc., as well as for deposition of inorganic semiconductor compounds, such as $A_{III}B_V$ compounds, SiC, etc., insofar as a reactive gas is available capable of undergoing pyrolytic decomposition in an equilibrium reaction wherein the formation of a hydrogen halide, such as HCl, is related to or decisive on the specific deposition rate for the semiconductor material being deposited. For example, this type of reaction occurs when methyl silicochloroform ($CH_3SiCl_3$) is converted with hydrogen to produce SiC on the surface of a heated mandrel. In all of the above instances, the optimum deposition rate is determined, then the deposition parameters are adjusted at the beginning of the deposition process to provide this optimum deposition rate and the flow rate of the reactive gas past the deposition site is adjusted in such a way that the concentration of a hydrogen halide in the exhaust gas remains constant or substantially constant. By following these guidelines one is guaranteed that the deposition rate is maintained throughout the entire process.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a process for depositing elemental silicon from a reactive gas comprised of a mixture of a halogen silane and hydrogen whereby the reactive gas flows through a reaction housing containing a heated mandrel on which silicon is deposited from such gas and wherein the deposition rate of silicon onto the mandrel surface varies during a course of the deposition process, the improvement comprising:

chronologically maintaining a relatively constant temperature at the mandrel surface and maintaining a relatively constant composition within the reactive gas;

varying the reactive gas through-put past the mandrel in such a manner that the deposition rate of silicon onto the mandrel surface remains substantially constant throughout the deposition process, said deposition rate being selected at the beginning of the deposition process in relation to the surface unit area of the mandrel and in relation to a unit time, so that the deposition rate of silicon per unit area of mandrel surface and per unit time is maintained so as to be at least 0.1 gram per square centimeter per hour and less than about 0.5 gram per square centimeter per hour; and monitoring the concentration of a hydrogen halide in an exhaust gas flowing from the reaction housing and generating a signal based on such concentration and feeding said signal to a control means for the supply of reactive gas which is in communication with the reaction housing so as to regulate the flow rate of reaction gas past the mandrel in such a manner that the concentration of said hydrogen halide in the exhaust gas remains chronologically substantially constant.

2. In a process as defined in claim 1 wherein the hydrogen halide in the exhaust gas is HCl and monitoring is accomplished by passing a monochromatic light beam having a wavelength corresponding to an absorption band of an HCl molecule through said exhaust gas to a photo-electric cell means which generates an electrical signal corresponding to a chronological concentration of HCl in said exhaust gas, transmitting said electrical signal to an evaluator means operationally coupled with said photo-electric cell means and with said controllable supply of reactive gas, regulating said supply of reactive gas via a control signal generated by said evaluator means in accordance with said electrical signal so as to maintain a substantially constant concentration of HCl in the exhaust gas.

3. In a process as defined in claim 1 wherein the hydrogen halide in the exhaust gas flowing from the reaction housing contains an amount of HCl therein and monitoring is accomplished by:

feeding a portion of said exhaust gas to a mass spectrograph which, while avoiding a conversion of any hydrogen silane present in the exhaust gas, produces a number of HCl ions corresponding to the amount of HCl in the exhaust gas, separating such HCl ions from other ions and generating a stream of HCl ions, producing an electrical signal corresponding to the density of HCl ions in said stream of HCl ions;

transmitting said electrical signal to an evaluator means operationally coupled to said controllable supply of reactive gas; and regulating said supply of reactive gas via a control signal generated by said evaluator means in accordance with said electrical signal so as to maintain a substantially constant concentration of HCl within the exhaust gas.

4. In a process as defined in claim 1 wherein the hydrogen halide in the exhaust gas flowing from the reaction housing contains an amount of HCl therein and monitoring is accomplished by:

feeding a portion of said exhaust gas into a gas chromatograph which quantitatively determines the amount of HCl in said portion via a heat conductivity measurement cell and generates an electrical signal corresponding to the concentration of HCl in said exhaust gas;

transmitting said signal to an evaluator means operationally coupled to said controllable supply of reactive gas; and regulating said supply of reactive gas via a controlled signal generated by said evaluator means in accordance with said electrical signal so as to maintain a substantially constant concentration of HCl within the exhaust gas.

* * * * *